United States Patent [19]
Blanken et al.

[11] Patent Number: 5,162,751
[45] Date of Patent: Nov. 10, 1992

[54] AMPLIFIER ARRANGEMENT

[75] Inventors: Pieter G. Blanken; Franciscus J. M. Thus, both of Eindhoven, Netherlands

[73] Assignee: U.S. Philips Corporation, New York, N.Y.

[21] Appl. No.: 752,720

[22] Filed: Aug. 30, 1991

[30] Foreign Application Priority Data

Sep. 6, 1990 [NL] Netherlands .......................... 9001966

[51] Int. Cl.$^5$ ............................................... H03F 3/45
[52] U.S. Cl. ...................................... 330/257; 330/255
[58] Field of Search .......................... 330/257, 255, 262

[56] References Cited

U.S. PATENT DOCUMENTS

| | | | |
|---|---|---|---|
| 4,228,404 | 10/1980 | Widlar | 330/267 |
| 4,292,584 | 9/1981 | Kusakabe | 330/257 |
| 4,335,358 | 6/1982 | Hoeft | 330/255 |
| 4,689,580 | 8/1987 | Fukuda et al. | 330/257 |
| 4,714,894 | 12/1987 | Gulczynski | 330/257 |
| 4,800,339 | 1/1989 | Tanimoto et al. | 330/255 |
| 5,039,953 | 8/1991 | Su | 330/255 |

Primary Examiner—Eugene R. LaRoche
Assistant Examiner—Tan Dinh
Attorney, Agent, or Firm—Bernard Franzblau

[57] ABSTRACT

An amplifier circuit includes a driver stage made up of a differential pair and which is coupled to an output stage consisting of a first output transistor and a second output transistor having a common terminal coupled to the output signal terminal of the amplifier circuit. The driver stage provides class AB operation of the output transistors at a comparatively low supply voltage. In order to obtain such operation, a translinear network including the differential pair and a diode-connected transistor is coupled directly to a current mirror which includes the second output transistor. The translinear network and the current mirror dictate the setting of the first and the second output transistor, respectively.

28 Claims, 3 Drawing Sheets

AMPLIFIER ARRANGEMENT

BACKGROUND OF THE INVENTION

This invention relates to an amplifier arrangement comprising a driver stage, which the driver stage comprises an input signal terminal, a differential pair having a first and a second input terminal, a common terminal, and a first and a second output terminal. The second input terminal is coupled to a first supply terminal by means of a unidirectional element. An output stage, of the amplifier comprises an output signal terminal, a first output transistor of a first conductivity type having a base coupled to the first input terminal, an emitter coupled to the first supply terminal, and a collector coupled to the output signal terminal, and a second output transistor of a second conductivity type having a base coupled to the second output terminal, an emitter coupled to a second supply terminal, and a collector coupled to the output signal terminal. The first output transistor, the differential pair and the unidirectional element constitute a translinear network.

Such an amplifier arrangement is suitable for general purposes and can be used advantageously in integrated semiconductor circuits, the driver stage being particularly suitable for realizing class AB operation of the output transistors.

Such an amplifier arrangement is known from the article entitled "Low voltage operational amplifier with rail-to-rail input and output ranges", which article has been published in the "IEEE Journal of Solid-State Circuits" of December 1985, Vol. SC-20, No. 6, pp. 1144–1150. FIG. 4 of this article shows an amplifier stage which forms part of the operational amplifier described and which, in order to obtain class AB operation of the output transistors, comprises a further unidirectional element coupled between the second input terminal and the first supply terminal, in series with the unidirectional element, and a current source coupled between the second input terminal and the second supply terminal. In operation, the current source consequently supplies both unidirectional elements with a current, resulting in a reference voltage between the second input terminal and the first supply terminal, the driver stage realising the class AB operation on the basis of this reference voltage.

A drawback of the known amplifier arrangement is the supply voltage which it requires, which voltage, as a result of the presence of the unidirectional elements and the current source should be at least equal to two junction voltages plus one saturation voltage. As a result of this, the required supply voltage is larger than, for example, a voltage supplied by a standard button cell (1.2 V), which prohibits the use of the known amplifier arrangement in some circuits requiring a comparatively low supply voltage, such as, for example, hearing-aid circuits.

SUMMARY OF THE INVENTION

It is an object of the invention to provide an amplifier arrangement capable of realising class AB operation at comparatively low supply voltages.

An amplifier arrangement in accordance with the invention is characterized in that, for driving the second output transistor, the driver stage comprises a current mirror coupled to at least the second output terminal. To realise class AB operation the amplifier arrangement in accordance with the invention advantageously utilizes the translinear network, a first current applied to the unidirectional element resulting in a first reference voltage between the second input terminal and the first supply terminal, and a second current applied to the differential pair via the first output terminal resulting in a second reference voltage between the first input terminal and the common terminal. Depending on the applied currents and the resulting reference voltages the differential pair generates a first voltage between the second input terminal and the common terminal and a third current, which is related to the first voltage, via the second output terminal, the reference voltages and the first voltage further defining a second voltage between the first input terminal and the first supply terminal. The setting of the first output transistor is dictated by this second voltage, while, in accordance with the invention the setting of the second output transistor is dictated by the third current, which is related to the first voltage via the current mirror. Consequently, the setting of the first and the second transistor are each determined on the basis of a reference voltage across a junction of the translinear network, which results in the required class AB operation, the required minimum supply voltage being equal to one junction voltage, as a result of the current mirror, plus two saturation voltages, as a result of the differential pair and a tail current source coupled between the common terminal and the first supply terminal.

A first embodiment of an amplifier arrangement in accordance with the invention may be characterized in that the current mirror comprises the second output transistor and a further unidirectional element, which element is coupled between the second output terminal and the second supply terminal. In the present embodiment the further unidirectional element and the second output transistor function as the current-mirror input and output respectively, so that the third current related to the first voltage provides the setting of the second output transistor in a comparatively simple manner. The required minimum supply voltage does not change as a result of the use of the further unidirectional element because this element operates correctly with said one junction voltage.

A second embodiment of an amplifier arrangement in accordance with the invention may be characterized in that the input signal terminal is coupled to the common terminal and the first input terminal is coupled to the first output terminal. This embodiment provides a first method of applying an input signal to the amplifier arrangement. The amplifier arrangement in accordance with the invention may then be characterized further in that the driver stage comprises a current source and a buffer transistor having a base coupled to the input signal terminal, having an emitter coupled to the common terminal, and having a collector coupled to the second supply terminal by means of the current source. The current source and the buffer transistor constitute a buffer stage, which reduces the load presented to the driver stage by a signal source coupled to the input signal terminal. The present embodiment may be characterized further in that the tail current source comprises a transistor of the first conductivity type, having a main current path coupled between the common terminal and the first supply terminal, and having a base coupled to the collector of the buffer transistor. As a result of its arrangement the transistor operating as a tail current source receives an adequate base-emitter voltage without the requirement of an undesirable increase in the supply voltage.

A third embodiment of an amplifier arrangement in accordance with the invention may be characterized in that the input signal terminal is coupled to the first input terminal. This embodiment provides a second method of applying an input signal to the amplifier arrangement. The amplifier arrangement in accordance with the invention may then be characterized further in that the driver stage comprises a further differential pair having a non-inverting input coupled to the input signal terminal, having an inverting input coupled to the first input terminal, and having an output terminal coupled to the base of the first output transistor. The further differential pair forms a buffer stage, which reduces the load presented to the driver stage by the signal source coupled to the input terminal. The present embodiment may be characterized further in that the tail current source comprises a transistor of the first conductivity type having a main current path coupled between the common terminal and the first supply terminal, and having a base coupled to the first output terminal. As a result of its arrangement the transistor operating as a tail current source receives an adequate base-emitter voltage without the requirement of an undesirable increase in the supply voltage.

A fourth embodiment of an amplifier arrangement in accordance with the invention may be characterized in that the driver stage comprises a further current mirror having an input terminal and an output terminal, and a transistor of the first conductivity type having a main current path coupled between the input terminal of the further current mirror and the first supply terminal, and having a base coupled to the base of the first output transistor, the output terminal of the further current mirror being coupled to the first output terminal. A current related to a main current flowing through the first output transistor is fed to the first output terminal by the further current mirror, which terminal already carries the second current. Advantageously, the present embodiment, in which the driver stage comprises a current source coupled between the first output terminal and the second supply terminal, may be characterized further in that the current source comprises a transistor of the second conductivity type having a main current path coupled between the first output terminal and the second supply terminal, and having a base coupled to the base of the second output transistor. Consequently, the second current is supplied by the current source, the second current being related to a main current flowing through the second output transistor. As a result of this, two currents flow via the first output terminal, which currents are a measure of the respective main currents of the first and the second output transistor. The two currents provide class AB operation of the output transistors with a comparatively low cross-over distortion and an improved frequency response.

A fifth embodiment of an amplifier arrangement in accordance with the invention may be characterized in that the driver stage comprises a level-shifting circuit coupled between the base of the first output transistor and the first input terminal, and in that the driver stage comprises a further level-shifting circuit coupled between the second input terminal and the first supply terminal in series with the unidirectional element. Both level-shifting circuits produce a voltage drop enabling the driver stage to be dimensioned more simply. This embodiment may be characterized further in that the level-shifting circuits each comprise a resistor.

A sixth embodiment of an amplifier arrangement in accordance with the invention may be characterized in that the driver stage comprises a buffer amplifier coupled between the base of the first output transistor and the first input terminal, and in that the driver stage comprises a further buffer amplifier coupled between the second output terminal and the base of the second output transistor. The two buffer amplifiers each reduce the load presented to the associated output transistor by the driver stage.

A seventh embodiment of an amplifier arrangement in accordance with the invention may be characterized in that the driver stage comprises a current mirror circuit coupled to the second input terminal, which current mirror circuit comprises at least the unidirectional element. The current mirror circuit constitutes a low a.c. impedance, which reduces the load presented to the second input terminal.

BRIEF DESCRIPTION OF THE DRAWINGS

The aforementioned and other (more detailed) features of the invention will now be described in more detail, by way of example, with reference to the accompanying drawings, in which.

DESCRIPTION OF THE PREFERRED EMBODIMENTS

Figure 1:
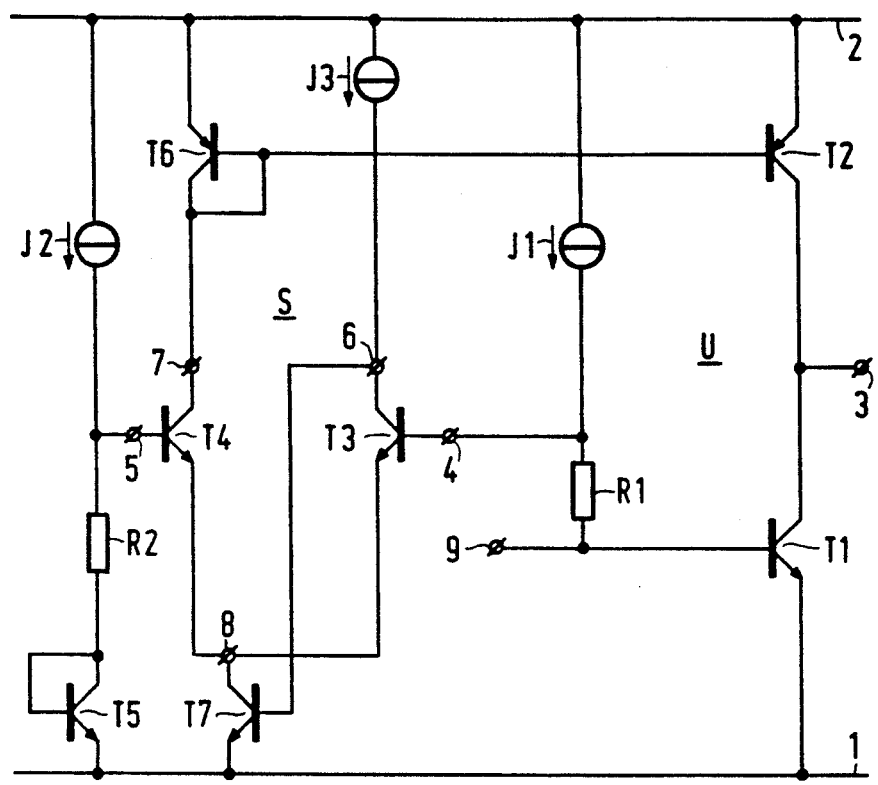
FIG. 1 shows an embodiment of an amplifier arrangement in accordance with the invention.

In these Figures similar parts bear the same reference numerals.

FIG. 1 shows an embodiment of an amplifier arrangement in accordance with the invention. The amplifier arrangement comprises an output stage U comprising a first output transistor T1 and a second output transistor T2, whose main current paths are serially coupled between a first supply terminal 1 and a second supply terminal 2, and a driver stage as adapted to provide class AB operation of said output transistors. The emitters of the output transistors T1 and T2 are coupled to the supply terminals 1 and 2, respectively, and the collectors of the output transistors T1 and T2 are coupled to an output terminal 3. The bases of the output transistors T1 and T2 are connected to the driver stage S, which comprises a differential pair T3, T4 having a first input terminal 4, a second input terminal 5, a first output terminal 6, a second output terminal 7 and a common terminal 8. The input terminal 4 is coupled to an input signal terminal 9 and to the base of the output transistor T1 by a resistor R1, and also to the supply terminal 2 via a current source J1. The input terminal 5 is coupled to the supply terminal 1 by means of a resistor R2 and a unidirectional element in the form of a diode-connected transistor T5, and to the supply terminal 2 by means of a current source J2. The output terminals 6 and 7 are both coupled to the supply terminal 2, i.e. the output terminal 6 by means of a current source J3 and the output terminal 7 by means of a further unidirectional element in the form of a diode-connected transistor T6. Since the output terminal 7 is also connected to the base of the output transistor T2, the transistors T6 and T2 form a current mirror T2, T6. The common terminal 8 of the differential pair T3, T4 is coupled to the supply terminal 1 by means of the main current path of a transistor T7, which functions as a tail current source and which has its base coupled to the output terminal 6. In order to realise class AB operation the amplifier arrangement in accordance with the invention advantageously utilises a translinear network formed by the output transistor T1, the differential pair T3, T4 and the transistor T5. The current source J2 feeds a first current to the series-connection of the resistor R2 and the transistor T5 to define a first reference voltage between the input terminal 5 and the supply terminal 1, and the current source J3 feeds a second current to the transistor T3 to define a second reference voltage between the input terminal 4 and the common terminal 8. Depending upon the applied currents and the resulting reference voltages, this produces a third current through the transistor T4 and a first voltage between the input terminal 5 and the common terminal 8, which reference voltages and first voltage define a second voltage between the input terminal 4 and the supply terminal 1. The setting of the output transistor T1 is dictated by the second voltage, and the third current, which is related to the first voltage, generates a third voltage across the transistor T6 to define the setting of the output transistor T2. Consequently, the settings of the output transistors T1 and T2 are each dictated by a reference voltage across a junction of the translinear network, which results in class AB operation. The minimum supply voltage required is then equal to one junction voltage, as a result of the transistor T6, plus two saturation voltages, as a result of the transistor T4 and the transistor T7, respectively. In order to obtain an adequate voltage across the transistor T7, this embodiment of the amplifier arrangement in accordance with the invention provides the resistors R1 and R2 as level-shifting circuits, but these circuits may be constructed in many other ways. In addition, the amplifier arrangement can be dimensioned in such a way that no level-shifting circuits are needed. A characteristic feature of the amplifier arrangement in accordance with the invention is that class AB operation of the output transistors is obtained by means of components which also provide amplification of the input signal. An input signal applied to the input terminal 9 is applied directly to the output transistor T1 and is applied in inverted form to the current mirror T2, T6 via the differential pair T3, T4.

Figure 2:
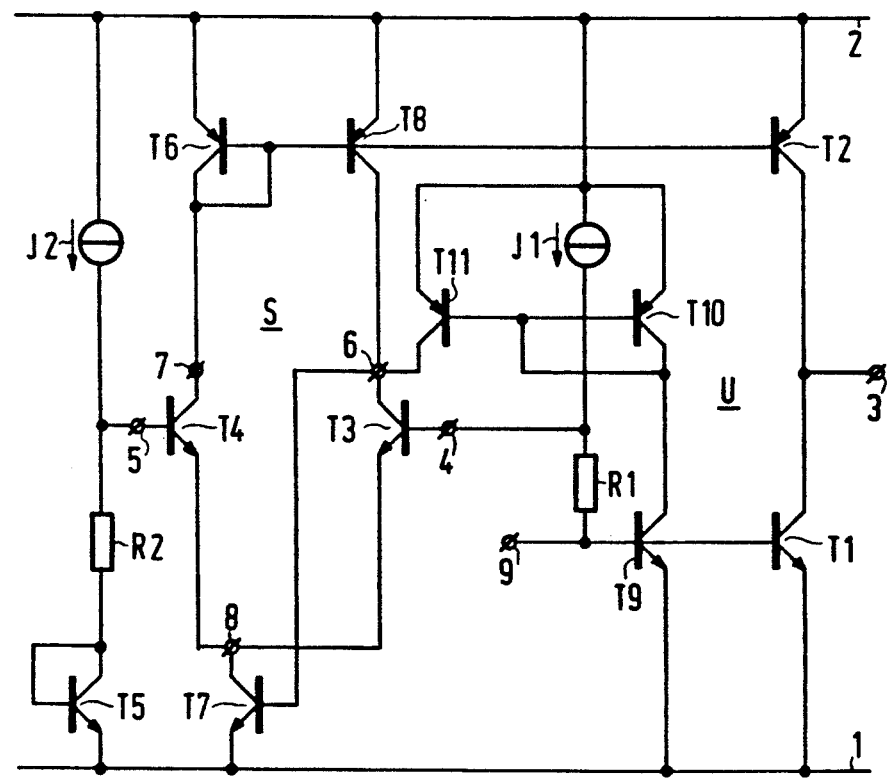
FIG. 2 shows a modification of the embodiment of an amplifier arrangement in accordance with the invention shown in FIG. 1.

FIG. 2 shows a modification of the embodiment of an amplifier arrangement in accordance with the invention shown in FIG. 1, the current source J3 being constructed as a transistor T8 having a main current path coupled between the output terminal 6 and the supply terminal, and having a base coupled to the base of the output transistor T2. Thus, the base-emitter junctions of the output transistor T2 and the transistor T8 are coupled in parallel so that the second current, supplied by the transistor T8, is related to the current through the output transistor T2. Moreover, this modification differs from the embodiment shown in FIG. 1 in that it comprises a transistor T9 having its base coupled to the base of the output transistor T1, and in that it comprises a further current mirror T10, T11 having its input coupled to the supply terminal 1 by the main current path of the transistor T9 and having its output coupled to the output terminal 6. Consequently, the base-emitter junctions of the output transistor T1 and the transistor T9 are arranged in parallel, so that a current supplied to the current mirror T10, T11 by the transistor T9 is related to a current flowing through the output transistor T1. As a result of this, the current mirror T10, T11 supplies a reproduced version of the current supplied by the transistor T9 to the transistor T3, so that this transistor carries a current which is substantially proportional to the sum of the currents through the output transistors T1 and T2. As a result of the components added, in comparison with the embodiment shown in FIG. 1, the present embodiment of the amplifier arrangement in accordance with the invention exhibits less potential variations in the driver stage S, resulting in an improved frequency response, in particular as regards the speed of the amplifier arrangement, and in a reduced cross-over distortion. Despite the additional components the supply voltage need not be increased.

Figure 3:
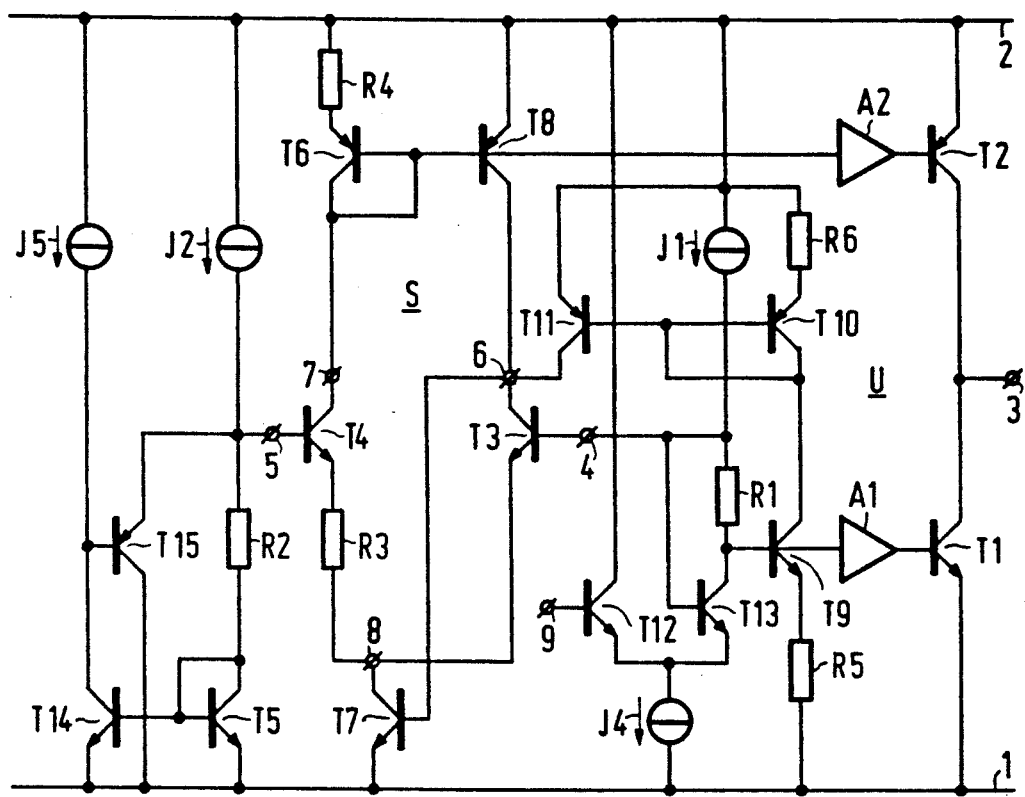
FIG. 3 shows a further modification of the embodiments of an amplifier arrangement in accordance with the invention shown in FIGS. 1 and 2.

FIG. 3 shows another modification of the embodiments of an amplifier arrangement in accordance with the invention shown in FIGS. 1 and 2. In addition to the components shown in FIGS. 1 and 2, this modified embodiment comprises a buffer stage T12, T13, J4 coupled between the input signal terminal 9 and the input terminal 4, a current mirror circuit T5, T14, T15, J5 coupled to the input terminal 5, two buffer amplifiers A1, A2 coupled in series to the bases of the output transistors T1, T2, and four emitter resistors R3, R4, R5, R6 coupled in series to the emitters of the transistors T4, T6, T9 and T10, respectively. The buffer stage T12, T13, J4 comprises a further differential pair T12, T13 having a non-inverting input terminal coupled to the input signal terminal 9, having an inverting input terminal coupled to the input terminal 4, and having an output terminal coupled to the base of the output transistor T1. In order to supply a tail current, the differential pair T12, T13 is further coupled to the supply terminal 1 by means of a current source J4, a further output of the differential pair T12, T13 being connected to the supply terminal 2. The buffer stage reduces the load presented to the driver stage by a signal source coupled to the input signal terminal 9. The input signal applied to the input signal terminal 9 is then applied in inverted form to the output transistor T1, i.e. at least if the buffer amplifier A1 does not produce an inversion. The current mirror circuit T5, T14, T15, J5 comprises a transistor T14 having its emitter coupled to the supply terminal 1, having its collector coupled to the supply terminal 2 by means of a current source J5, and having its base coupled base and collector to the mutually coupled electrodes of the transistor T5. Moreover, the transistor T15 has its main current path coupled between the input terminal 5 and the supply terminal 1, the base of the transistor T15 being connected to the collector of the transistor T14. The current mirror circuit thus formed acts to reduce the signal current impedance between the input terminal 5 and the supply terminal 1, which results in an improved frequency response of the amplifier arrangement. The buffer amplifiers A1 and A2 used in this embodiment each serve as current amplifiers. As a result of this, they reduce the load presented to the output stage U and enable the signals in the driver stage to be minimized, which is attended with a reduced power dissipation. Finally, the present embodiment provides a method of making the current-mirror factors of the current mirrors used unequal to unity. Although this can be achieved simply by selecting unequal emitter areas for the relevant transistors, the present embodiment, by way of illustration, utilises said emitter resistors R3, R4, R5 and R6 to accomplish this purpose. Thus, for example the transistor T9 will carry a smaller current than the output transistor T1 because the base-emitter voltage of the transistor T9 is smaller. Although this embodiment only illustrates scaling of the currents through the transistors T1 and T9, T2 and T6, T3 and T4, and T10 and T11, it is also possible to scale the currents through the transistors T2 and T8 on the one hand and the transistors T6 and T8 on the other hand.

Figure 4:
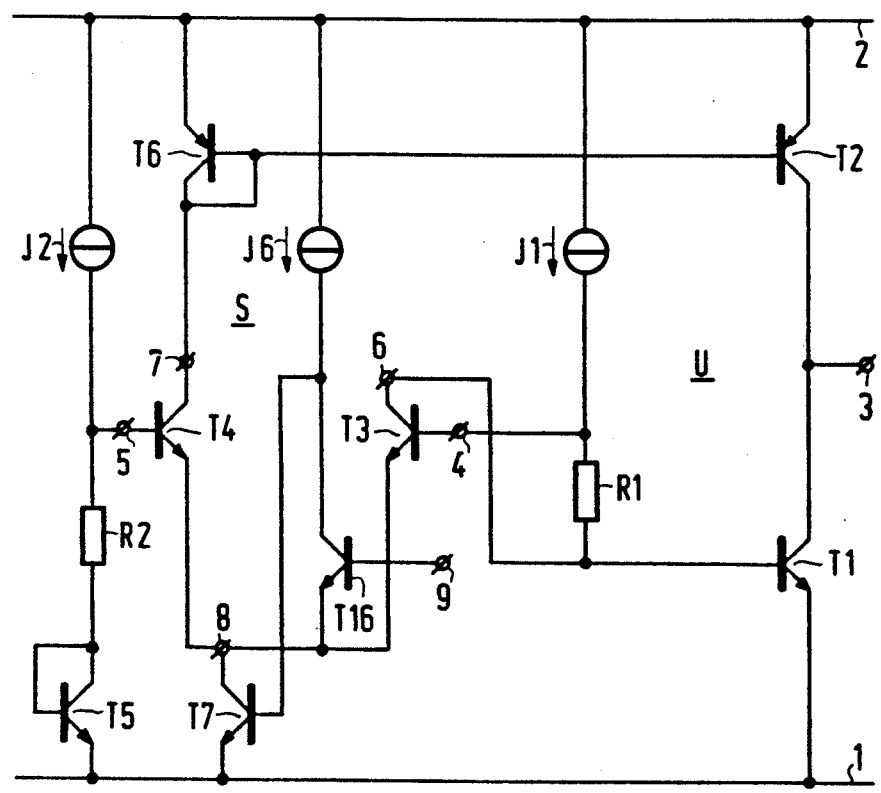
FIG. 4 shows another embodiment of an amplifier arrangement in accordance with the invention.

FIG. 4 shows another embodiment of an amplifier arrangement in accordance with the invention. This embodiment differs from the embodiment shown in FIG. 1 in that the input signal terminal 9 is coupled to the common terminal 8 by means of a buffer stage T16, J6, the current source J3 being dispensed with although this is not necessary, and the output terminal 6 is coupled to the base of the output transistor T1. The buffer stage T16, J6 comprises a transistor T16, which has its base coupled to the input signal terminal 9, and a current source J6, which couples the supply terminal 2 to the common terminal 8 via the main current path of the transistor T16, the base of the transistor T7 being coupled exclusively to a point between the current source J6 and the main current path of the transistor T16. Thus, the current source J1 supplies the required second current to the transistor T3 and, as a result of the coupling of its base, the transistor T7 receives an adequate drive permitting it to function as the tail current source of the differential pair T3, T4. In principle, the present embodiment is merely a simplified method of applying an input signal to the amplifier arrangement shown in FIG. 3, in which the buffer stage T12, T13, J4 has been replaced by the buffer stage T16, J6 and the transistors T16 and T3 operate similarly to the differential pair T12, T13.

Figure 5:
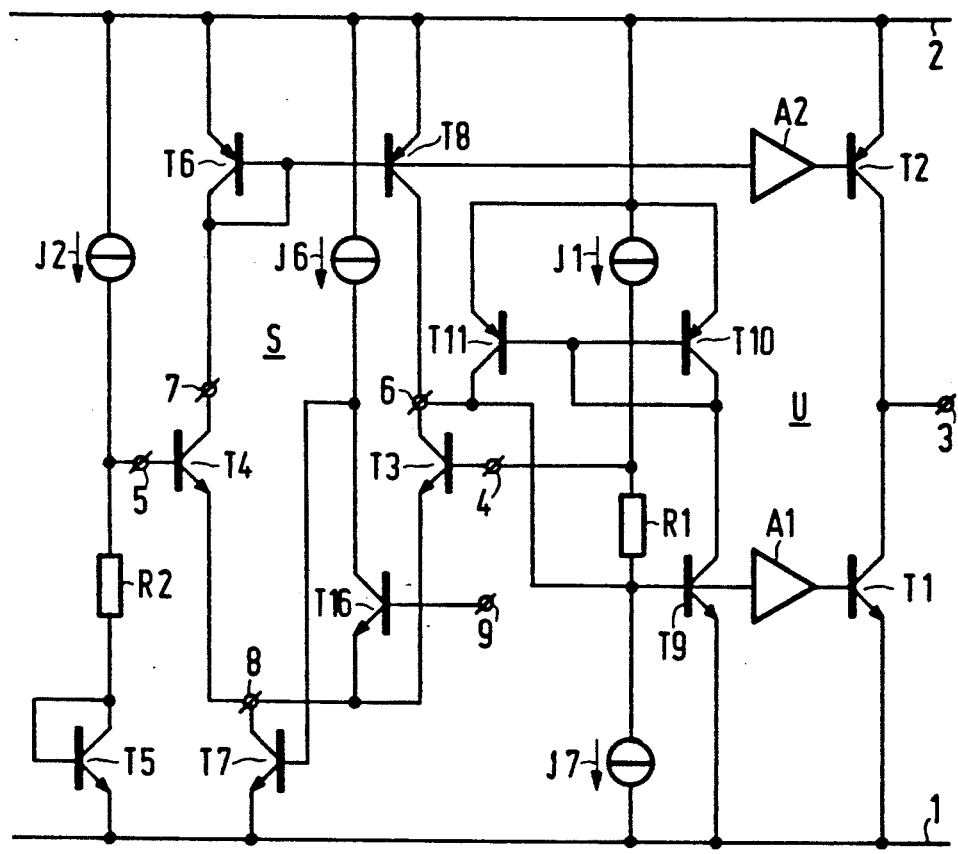
FIG. 5 shows a modification of the embodiment of an amplifier arrangement in accordance with the invention shown in FIG. 4.

FIG. 5 shows a modification of the embodiment of an amplifier arrangement in accordance with the invention shown in FIG. 4. In addition to the parts shown in FIG. 4 this embodiment also comprises some parts already shown in FIG. 3, i.e. the current-source transistors T8 and T9, the current mirror T10, T11 and the buffer amplifiers A1 and A2. Moreover, this embodiment comprises a current source J7 coupled between the output terminal 6 and the supply terminal 1 to drain the current fed to the resistor R1 by the current source J1. In FIG. 4 this current is drained via the transistor T3 but in the present embodiment the transistor T8 and the current mirror T10, T11 dictate the current through the transistor T3. In order not to disturb this current setting and the effect of this described with reference to FIG. 3, the current source J7 has been added. For the remainder the amplifier arrangement shown and its parts operate as described with reference to the preceding Figures. The required supply voltage is also the same.

The invention is not limited to the embodiments shown herein. Several modifications are conceivable to those skilled in the art without departing from the scope of the invention. For example, the parts of the embodiments shown can be combined with one another in various ways and it is also possible to utilize transistors of opposite conductivity types.

We claim:

1. An amplifier arrangement comprising a driver stage which includes an input signal terminal and a differential pair having a first and a second input terminal, a common terminal and a first and a second output terminal, the second input terminal being coupled to a first supply terminal by means of a unidirectional element, and an output stage which comprises an output signal terminal, a first output transistor of a first conductivity type having a base coupled to the first input terminal, an emitter coupled to the first supply terminal, and having a collector coupled to the output signal terminal, and a second output transistor of a second conductivity type having a base coupled to the second output terminal, an emitter coupled to a second supply terminal, and a collector coupled to the output signal terminal, the first output transistor, the differential pair and the unidirectional element constituting a translinear network, and wherein, for driving the second input transistor, the driver stage further comprises a current mirror coupled to at least the second output terminal.

2. An amplifier arrangement as claimed in claim 1, wherein the current mirror comprises the second output transistor and a further unidirectional element which is coupled between the second output terminal and the second supply terminal.

3. An amplifier arrangement as claimed in claim 2, wherein the input signal terminal is coupled to the common terminal and the first input terminal is coupled to the first output terminal.

4. An amplifier arrangement as claimed in claim 3, wherein the driver stage comprises a buffer transistor having a base coupled to the input signal terminal, an emitter coupled to the common terminal, and a collector coupled to the second supply terminal by means of a current source.

5. An amplifier arrangement as claimed in claim 4, wherein the driver stage further comprises a tail current source coupled between the common terminal and the first supply terminal, wherein the tail current source comprises a transistor of the first conductivity type having a main current path coupled between the common terminal and the first supply terminal and a base coupled to the collector of the buffer transistor.

6. An amplifier arrangement as claimed in claim 1, wherein the input signal terminal is coupled to the first input terminal.

7. An amplifier arrangement as claimed in claim 6, wherein the driver stage comprises a further differential pair having a non-inverting input coupled to the input signal terminal, an inverting input coupled to the first input terminal, and having an output terminal coupled to the base of the first output transistor.

8. An amplifier arrangement as claimed in claim 6, wherein the driver stage comprises a tail current source coupled between the common terminal and the first supply terminal, and the tail current source comprises a transistor of the first conductivity type having a main current path coupled between the common terminal and the first supply terminal, and a base coupled to the first output terminal.

9. An amplifier arrangement as claimed in claim 1, wherein the driver stage comprises a further current mirror having an input terminal, an output terminal and a transistor of the first conductivity type having a main current path coupled between the input terminal of the further current mirror and the first supply terminal, and having a base coupled to the base of the first output transistor the output terminal of the further current mirror being coupled to the first output terminal.

10. An amplifier arrangement as claimed in claim 1, wherein the driver stage comprises a current source coupled between the first output terminal and the second supply terminal, and the current source comprises a transistor of the second conductivity type having a main current path coupled between the first output terminal and the second supply terminal, and having a base coupled to the base of the second output transistor.

11. An amplifier arrangement as claimed in claim 1, wherein the driver stage further comprises a level-shifting circuit coupled between the base of the first output transistor and the first input terminal.

12. An amplifier arrangement as claimed in claim 11, wherein the level-shifting circuit comprises a resistor.

13. An amplifier arrangement as claimed in claim 1, wherein the driver stage comprises a further level-shifting circuit coupled between the second input terminal and the first supply terminal and in series with the unidirectional element.

14. An amplifier arrangement as claimed in claim 13, wherein the further level-shifting comprises a resistor.

15. An amplifier arrangement as claimed in claim 1, wherein characterized in that the driver stage comprises a buffer amplifier coupled between the base of the first output transistor and the first input terminal.

16. An amplifier arrangement as claimed in claim 1, wherein the driver stage comprises a buffer amplifier coupled between the second output terminal and the base of the second output transistor.

17. An amplifier arrangement as claimed in claim 1, wherein the driver stage comprises a further current mirror circuit coupled to the second input terminal, which current mirror circuit comprises at least the unidirectional element.

18. An amplifier arrangement as claimed in claim 1, wherein the input signal terminal is coupled to the common terminal and the first input terminal is coupled to the first output terminal.

19. An amplifier arrangement as claimed in claim 2, wherein the input signal terminal is coupled to the first input terminal.

20. An amplifier arrangement as claimed in claim 6, wherein the drive stage comprises a further current mirror having an input terminal, an output terminal and a transistor of the first conductivity type having a main current path coupled between the input terminal of the further current mirror and the first supply terminal and having a base coupled to the base of the first output transistor, the output terminal of the further current mirror being coupled to the first output terminal.

21. An amplifier arrangement as claimed in claim 1 wherein the drive stage comprises a further level-shifting circuit coupled between the second input terminal and the first supply terminal and in series with the unidirectional element.

22. An amplifier arrangement as claimed in claim 15 wherein the drive stage comprises a further buffer amplifier coupled between the second output terminal and the base of the second output transistor.

23. An amplifier arrangement as claimed in claim 17 wherein the further current mirror circuit comprises a transistor coupled between the second input terminal and the first supply terminal.

24. An amplifier circuit for operation with a low DC supply voltage comprising:
an output stage including first and second output transistors serially coupled between first and second supply terminals of the DC supply voltage and having a common junction coupled to an output signal terminal of the amplifier circuit,
a driver stage comprising an input signal terminal and third and fourth transistors connected as a differential pair which includes first and second input terminals, first and second output terminals and a common terminal,
first means coupling a control electrode of the first output transistor to the first input terminal,
second means coupling a control electrode of the second output transistor to the second output terminal,
a unidirectional element coupling the second input terminal to said first supply terminal such that the first output transistor, the third and fourth transistors and the unidirectional element comprise a translinear network which provides class AB operation of the output transistors, and
a current mirror circuit coupled to the second output terminal so as to drive the second output transistor.

25. An amplifier circuit as claimed in claim 24 wherein the current mirror circuit comprises a diode element having a first terminal coupled to the second supply terminal and a second terminal coupled to the second output terminal whereby said second terminal is coupled to the control electrode of the second output transistor via the second coupling means.

26. An amplifier circuit as claimed in claim 24 wherein said input signal terminal is coupled to said first input terminal via a level shift circuit.

27. An amplifier circuit as claimed in claim 24 wherein the drive stage further comprises a current source including a further transistor coupled between the common terminal and the first supply terminal and having a control electrode coupled to the first output terminal.

28. An amplifier circuit as claimed in claim 24 wherein said input signal terminal is coupled to said first input terminal.

* * * * *

UNITED STATES PATENT AND TRADEMARK OFFICE
CERTIFICATE OF CORRECTION

PATENT NO. : 5,162,751
DATED : November 10, 1992
INVENTOR(S) : Pieter G. Blanken, et al It is certified that error appears in the above-indentified patent and that said Letters Patent is hereby corrected as shown below:

Column 1, line 6, change "," to --in--;
line 11, delete "," (comma).

Claim 1, column 8, line 1, after "comprising" insert --:--;
line 11, delete "having";
line 18, change "input" to --output--.

Claim 9, column 9, line 1, after "transistor" insert --,--.

Claim 13, column 9, line 17, change "1" TO --11--.

Claim 15, column 9, line 25, delete "characterized in that".

Signed and Sealed this

Nineteenth Day of April, 1994

Attest:

BRUCE LEHMAN

*Attesting Officer*  Commissioner of Patents and Trademarks